United States Patent [19]

Pan

[11] Patent Number: 5,463,647
[45] Date of Patent: Oct. 31, 1995

[54] BROADBAND MULTI-WAVELENGTH NARROW LINEWIDTH LASER SOURCE USING AN ELECTRO-OPTIC MODULATOR

[75] Inventor: Jing-Jong Pan, Milpitas, Calif.

[73] Assignee: The United States of America as represented by the Secretary of the Air Force, Washington, D.C.

[21] Appl. No.: 324,275

[22] Filed: Oct. 14, 1994

Related U.S. Application Data

[63] Continuation of Ser. No. 29,315, Feb. 25, 1993, abandoned.
[51] Int. Cl.$^6$ .................................................. H01S 3/11
[52] U.S. Cl. .................. 372/12; 372/26; 372/6; 372/20; 372/92; 372/44
[58] Field of Search ........................ 372/12, 6, 44, 372/26, 75, 69, 23, 92, 20

[56] References Cited

U.S. PATENT DOCUMENTS

| | | | |
|---|---|---|---|
| 4,558,448 | 12/1985 | dePoorter et al. | 372/44 |
| 4,558,449 | 12/1985 | Gordon | 372/44 |
| 4,564,946 | 1/1986 | Olsson et al. | 372/20 |
| 4,658,401 | 4/1987 | Segré et al. | 372/12 |
| 4,667,331 | 5/1987 | Alferness et al. | 372/12 |
| 4,847,851 | 7/1989 | Dixon | 372/75 |
| 4,993,035 | 2/1991 | Laikhtman | 372/50 |
| 5,068,867 | 11/1991 | Hasenberg et al. | 372/45 |
| 5,082,342 | 1/1992 | Wright et al. | 372/44 |

*Primary Examiner*—Léon Scott, Jr.
*Attorney, Agent, or Firm*—Robert L. Nathans; Stanton E. Collier

[57] ABSTRACT

A semiconductor laser diode is optically coupled to an electro-optic phase modulator and an electrical control signal is applied to the phase modulator to modify its optical gain or loss and its real refractive index, to in turn alter the optical length of the modulator and shift its resonant wavelengths. The result is to tune the laser diode. A facet of the laser diode is anti-reflection coated to minimize interface loss between the laser diode and the phase modulator.

11 Claims, 1 Drawing Sheet

BROADBAND MULTI-WAVELENGTH NARROW LINEWIDTH LASER SOURCE USING AN ELECTRO-OPTIC MODULATOR

STATEMENT OF GOVERNMENT INTEREST

The invention described herein may be manufactured and used by or for the Government for governmental purposes without the payment of any royalty thereon. This application is a continuation of application Ser. No. 08/029,315, filed 25 Feb. 1993, abandoned.

BACKGROUND OF THE INVENTION

The present invention relates to the field of coherent light sources.

Coherent fiber optic communication systems, high data rate fiber optic systems, and high frequency systems, sensors and signal processing systems demand highly stable, single-mode, narrow linewidth, and broadband tunable semiconductor laser sources. Conventional tunable laser sources using optical gratings, optical tunable filters, or adjustable external cavities have slow tuning speeds in the milli-second or micro-second range. Also, they have difficulty in attaining single-mode, narrow linewidth and broadband tuning simultaneously. Cleaved coupling cavity semiconductor lasers and multi-electrode laser diodes have undesirable narrow tuning ranges and very poor fabrication reproducibility and manufacturing yields.

BRIEF SUMMARY OF THE INVENTION

In accordance with the present invention, a broadband, narrow linewidth, tunable laser source is provided which substantially eliminates the aforesaid shortcomings of other tunable laser sources. The laser source can comprise a laser diode and an electro-optic phase modulator optically coupled thereto. At least one facet of the laser diode is anti-reflection coated, and an electrical control signal changes the refractive index of the electro-optic phase modulator to in turn tune the laser source.

BRIEF DESCRIPTION OF THE DRAWINGS

Various features and advantages of the present invention will become apparent upon study of the following description, taken in conjunction with the drawings in which.

DETAILED DESCRIPTION OF THE INVENTION

Figure 1:
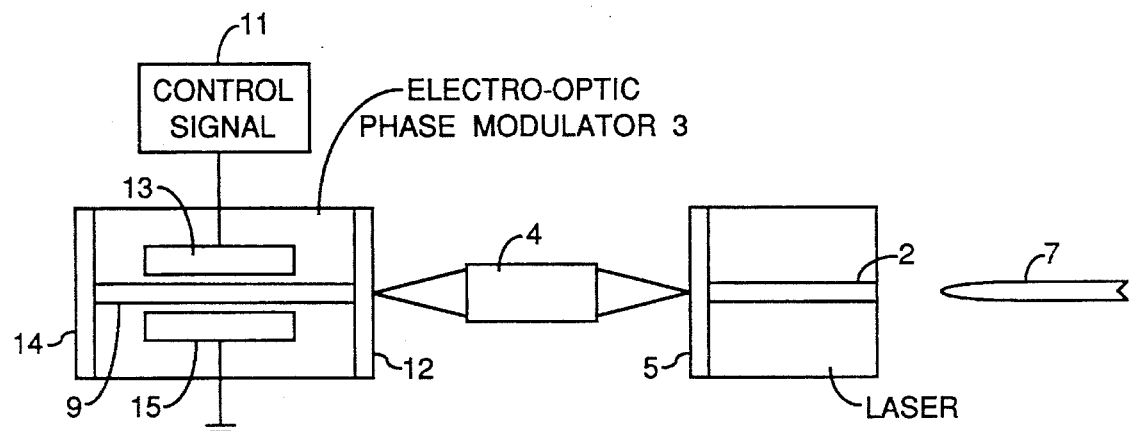
FIG. 1 illustrates a preferred embodiment of the invention.

Referring now to FIG. 1, a semiconductor laser diode 1, and an integrated electro-optic phase modulator or phase shifter 3 is shown. Laser diode 1 could be of the Fabry-Perot type or the multi-quantum-well type. At least one facet of the laser diode 1 has an anti-reflection coating 5 thereon to minimize interface loss between the laser diode cavity 2 and the electro-optic phase modulator 3, optically coupled thereto. The reflectivity of anti-reflection coating 5 shall be as small as possible to avoid parasitic Fabry-Perot resonances. Either a LiNbO or a semiconductor integrated optical waveguide phase shifter may be employed as the electronically (or optically) adjustable external cavity. The operational principle of the electro-optical phase modulator is well known to skilled workers in the art and thus need not be described herein. For one type of such a modulator, see U.S. Pat. No. 4,787,691 issued to Joseph Lorenzo and Richard Sorer. The output of the tunable source can feed into single-mode fiber 7 of FIG. 1, or a single-mode optical waveguide, or free space. The anti-reflection (AR) coated laser diode can be directly butted with the phase modulator, or interfaced therewith by using a short section of single-mode fiber 4 which is preferably micro-lensed in order to minimize coupling losses. An AR coating 12 on phase modulator 3 can be butted against AR coating 5 in the absence of single-mode fiber 4, while coating 14 can be metallic coated for high reflection.

Electrical signal source 11 is coupled to electrodes 13 and 15 and changes the real refractive index of the phase modulator to in turn shift its resonant wavelengths or the optical phase at the given wavelength. The diode laser experiences these variations through the effective field reflectivity at its facet.

Figure 2A:
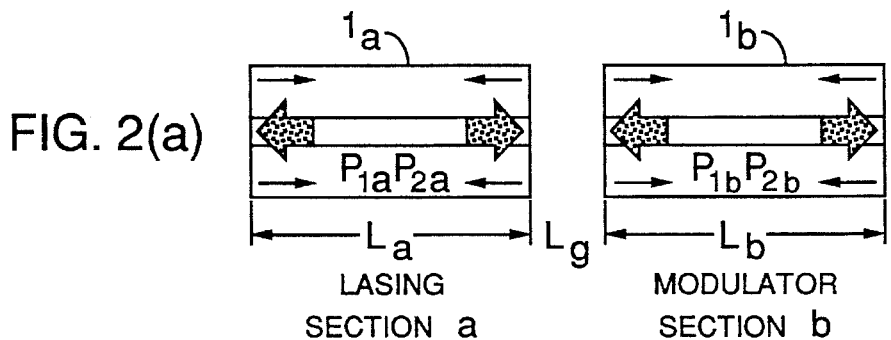
FIGS. 2(a), 2(b) and 2(c) schematically illustrate certain relationships between the modulator and lasing sections of the laser source of the invention.

A tunable laser diode source consisting of a laser diode (LD), an air gap, and an electro-optic modulator is shown in FIG. 2(a). The modulator can be a semiconductor, or LiNbO$_3$ electro-optic modulator (EOM). The lasing section designates a subscript of 'a', and the modulator section, a subscript of 'b'. The power reflection coefficient, $R_{1a}$, is determined by laser diode material and facet coating, if present. For the tunable laser diode source, the second reflectivity, $R_T$, incorporates the effect of external reflection. Both $R_{1a}$ and $R_T$ are equal to the squared magnitudes of modal field reflection coefficients, i.e., $R_{1a}=|\rho_{1a}|^2$ and $R_T=|\rho_T|^2$. Both $\rho_{1a}$ and $\rho_T$ are complex, and can be expressed as:

$$\rho_{1a}=|\rho_{1a}|e^{i\phi_{1a}} \tag{1}$$

and $$\rho_T=|\rho_T|e^{i\phi_T} \tag{2}$$

The effective reflectivity, $\rho_T$, of a tunable source is dependent upon the characteristics of air gap and modulator, and can be expressed as:

$$\rho_T = \frac{\rho_{2a}+\rho_{2t}e^{2\phi_g}}{1+\rho_{2a}\rho_{2t}e^{2\phi_g}} \tag{3}$$

where:

$$2\phi_g = 2\alpha_g + i2k_oL_g \tag{4}$$
$$= 2\alpha_g + i\delta_g$$

$\delta_g = 2\pi L_g/\lambda$ $k_0 = 2\pi/\lambda$ $\alpha_g$ is the spatial coupling factor between the lasing mode in the two sections $k_o$ is the propagation constant in the air gap $L_g$ is the length of the air gap $\rho_{2t}$ is the equivalent reflector for the modulator $$\rho_{2t} = \frac{-\rho_{1b}+\rho_{2b}e^{2\phi_b}}{1-\rho_{1b}\rho_{2b}e^{2\phi_b}} \tag{5}$$

$2\phi_b = \theta_b + i2k_o n_b L_b$ $\theta_b$ is the modal gain per pass in the modulator $n_b$ is the refractive index of the modulator (or the equivalent modal index near lasing wavelength for the laser diode or superluminescent diode (SLD)

The equivalent modal index near the lasing wavelength for the laser diode will be obtained from:

$$n_1 = n_{01} - 0.02 \, \Gamma_x \, e^{12.4(\lambda^{-1} - 0.84^{-1})} \cdot [I_1/(w_{eff} t \, L_1 J_0)]^{1/2}, \; i=a,b \quad (6)$$

where:

$\Gamma_x$ is the confinement factor $$\Gamma_x = (6.61t)^2/[(6.61t)^2 + 2] \quad (7)$$

$W_{eff}$ is the effective width, including the overlap between the spontaneous emission distribution and the lateral modal intensity distribution $I_1$, i=a, b is the current of laser and modulator, respectively t is the laser diode active region thickness For passive EOM $(I_p/w_{eff} t \, L_p J_0)^{1/2}$ can be replaced by $(J/J_0)^2$, where J is the volume current density.

The modal gain factors $\theta_1$, i=a, b is expressed as, $$\theta_1 = [\alpha_1 e^{(\sigma-k)\xi} - \alpha_i - \Gamma_x B_s e^{\sigma \xi}] L_1, \; i=a,b \quad (8)$$

where $$\alpha_1 = \Gamma_x A_s r_1 / w_{eff} L_1 \quad (9)$$

$r_1$ is the total rate of injected carrier spontaneous recombination $$r_1 = \eta_1 I_1/e, \; i=a, b \quad (10)$$

$\eta_1$ is a constant efficiency factor $A_s$ is determined for a given laser by the slope of its gain-current relationship:

$$A_s = [B_s e^{k(E-h\nu_s)}]/r_{sp} \quad (11)$$

$r_{sp}$ is the spontaneous emission rate per unit volume and is proportional to the pumping current below threshold.

$$k = 1/kT \quad (12)$$

$$\xi = h\nu - h\nu_s \quad (13)$$

$\sigma$ is a constant which describes the measured exponential fall-off of the band-to-band absorption as the photon energy decreases from the reference value $B_s$ is the coefficient of band-to-band absorption at $\nu = \nu_s$ $\alpha_i$ is the intrinsic optical losses per unit length The change of modulation current (for semiconductor EOM) or modulation voltage (for $LiNbO_3$ EOM) modifies the optical gain (or loss) and the real refractive index of the modulator segment. In turn, changes in the real refractive index will alter the optical length of modulator segment and shift its resonant wavelengths. The lasing segment 'a' experiences those variations, through the effective field reflectivity at its facet.

Both threshold current and lasing wavelength of lasing segment 'a' change with the variations of the equivalent effective reflectivity (phase and magnitude).

The optical oscillation must satisfy the following gain and phase conditions simultaneously $$|\rho_T||\rho_{1a}| e^{\theta_a} 32 \; 1 \quad (14)$$

and $$\phi_T + 2\beta_a L_a = 2n\pi, \; n=0, 1, 2, 3 \ldots \quad (15)$$

where $\beta_a$ is the modal propagation constant of segment 'a'.

(3) An Example: $LiNbO_3$ EOM $LiNbO_3$ EOM's phase variation is depending on the refractive index change, induced by the applied voltage. The effective electro-optically induced index change within a cross section of the optical mode (at DC bias) can be written as:

$$\Delta n(V) = -\frac{n^3 r}{2} \frac{V}{G} \Gamma \quad (16)$$

where $\Gamma$ is the overlap integral between the applied electric field and optic mode. When the phase modulator is operating at a given frequency (f), a given characteristic impedance of transmission line $(Z_0)$, and a load $(R_L)$, the induced index change can be expressed as:[1]

$$\Delta n(f,V) = -\frac{n^3 r_{33}}{2G} \frac{Z_{in} V_g L \exp\left(j \frac{2\pi f n L}{c}\right)}{M \exp(\gamma_m L) + N \exp(-\gamma_m L)} \cdot$$
$$\left[ (R_L + Z_m) \frac{1 - \exp(u_+)}{u_+} + (R_L - Z_m) \frac{1 - \exp(u_-)}{u_-} \right] \quad (17)$$

where $$\gamma_m = \alpha_m + j\beta_m \quad (18)$$

$$M = (R_L + Z_m)(Z_0 + Z_{in}) \quad (19)$$

$$N = (R_L - Z_m)(Z_0 + Z_{in}) \quad (20)$$

$$Z_{in} = Z_m [R_L + Z_m \tanh(\gamma_m L)] / [Z_m + R_L \tanh(\gamma_m L)] \quad (21)$$

$$u_\pm = [j 2\pi f(-n \pm \sqrt{c_{eff}})/c \pm \alpha_m] L \quad (22)$$

$$c_{eff} = (1 + \sqrt{c_{11} c_{33}})/2 \quad (23)$$

$\alpha_m$ is the attenuation constant $\beta_m$ is the phase constant $R_L$ is the load resistance $Z_m$ is the characteristic impedance of traveling-wave electrodes $Z_0$ is the internal impedance of the driver $Z_{in}$ is the input impedance n is the refractive index of waveguide $\epsilon_{eff}$ is the effective dielectric constant of substrate $V_g$ is the driving voltage with the open circuit L is the electrode length $\epsilon_{11}$ and $\epsilon_{33}$ are specific dielectric constants The phase shift over the interaction length is:

$$\Delta \beta = k n(f) \text{ where } k = 2\pi/\lambda. \quad (24)$$

For the LD-EOM tunable optical source, the EOM can be dc and RF voltage tuned.

Operational Principle of Tunable LD-EOM Optical Source

Figure 2B:
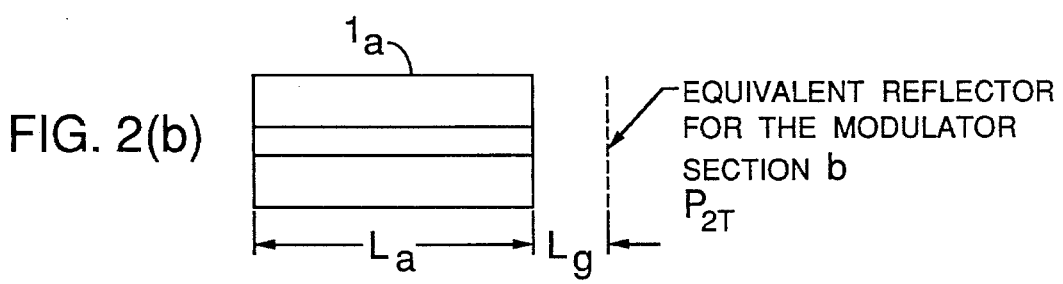

Referring to FIG. 2(b), the equivalent reflector for the EOM, $\rho_{2l}$, can be expressed as:

$$\rho_{2l} = \frac{-\rho_{1b} + \rho_{2b}e^{2\psi_b}}{1 - \rho_{1b}\rho_{2b}e^{2\psi_b}} \quad (25)$$

where $$\psi_b = \theta_b/2 + i\beta_b L_b \quad (26)$$

$$\theta_b = -\alpha_r L_b \quad (27)$$

$\alpha_{65}$ is the intrinsic optical losses of EOM $$\beta_b = k_0 n(f, V) \quad (28)$$

$$k_0 = 2\pi/\lambda \quad (29)$$

Figure 2C:
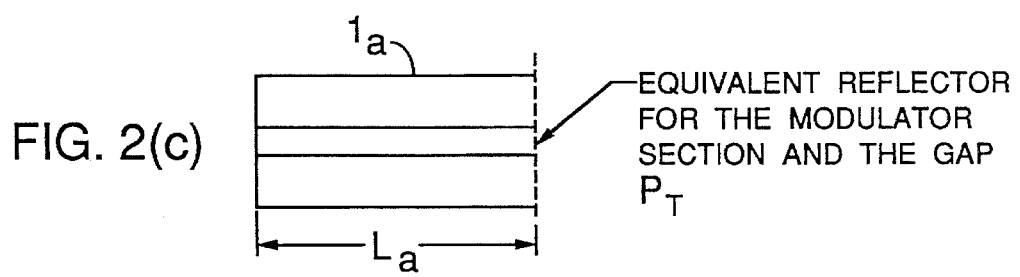

Then, the equivalent reflector at left hand side of air gap [referring to FIG. 2(c), $\rho_T$, is given as:

$$\rho_T = \frac{\rho_{2a} + \rho_{2t}e^{2\psi_g}}{1 + \rho_{2a}\rho_{2t}e^{2\psi_g}} \quad (30)$$

where $$2\psi_g = 2\alpha_g + i2k_0 L_g$$

The wavelength tuning characteristics of laser diode and LiNbO$_3$ EOM tunable optical source can be computed using Equations (17) through (30).

The experimental tunable laser configuration consists of a laser and a LiNbO$_3$ EOM. One facet of the laser is AR coated. One facet of EOM is AR coated and the other facet is metallic coated for high reflection. The AR coated facets of laser and EOM are butted to each other. The laser's active channel must be perfectly aligned to the EOM optical waveguide in order to minimize coupling loss. The alignment accuracy was better than 0.3 μm. To avoid accidentally damaging a laser facet, the laser-to-EOM interface can be achieved by using a short piece of lensed fiber.

The output of this tunable device can be derived from either the laser end or at the EOM end, if the OEM output facet is not metallic coated. Output fiber interfaced with uncoated laser facet is preferred in order to obtain a relatively high output power.

The tuning range of the OKI lasers with a LiNbO$_3$ (#CS024) are in the range of 110 Å to 140 Å, which are very close to the theoretical computation (120 A–140 A).

The spectral linewidth of the laser-EOM tunable sources are in the range of 100 kHz to 1 MHz, without thermal isolation.

I claim:

1. A tunable laser source apparatus enabling a laser diode to be pumped to lase in an extra-cavity environment having no external reflectors and thus consisting essentially of:
   (a) an optical phase modulator optically coupled to said laser diode; and
   (b) tuning control means for shifting the phase of a light wave modulated by the optical phase modulator such that a resonant frequency of said light wave is shifted.

2. The tunable laser source of claim 1 wherein at least one facet of the laser diode is anti-reflection coated to minimize interface loss between the laser diode and the optical phase modulator.

3. The tunable laser source apparatus of claim 2 wherein the optical phase modulator has one facet that is anti-reflection coated and a second opposite facet that has a high reflectivity.

4. The tunable laser source apparatus of claim 1 wherein the optical phase modulator has one facet that is anti-reflection coated and a second opposite facet that has a high reflectivity.

5. A tunable laser source apparatus enabling a laser diode to be pumped to lase in an extra-cavity environment having no external reflectors and thus consisting essentially of:
   (a) a laser diode having an anti-reflective coating on a first facet thereof;
   (b) an optical phase modulator optically coupled to said laser diode and having an anti-reflective coating facing the anti-reflective coating of said laser diode and having a reflective coating upon a facet opposite to the anti-reflective coating of said optical phase modulator; and
   (c) tuning control means for shifting the phase of a light wave being modulated by the optical phase modulator such that a resonant frequency of said light wave is shifted.

6. The laser source of claim 5 wherein a second facet of the laser diode, opposite the first facet thereof, is uncoated.

7. The laser source of claim 6 including a lensed fiber for optically coupling the optical phase modulator to the laser diode.

8. The laser source of claim 5 including a lensed fiber for optically coupling the optical phase modulator to the laser diode.

9. A tunable laser source apparatus enabling a laser diode to be pumped to lase in an extra-cavity environment having no external reflectors comprising:
   (a) a laser diode having an anti-reflective coating on a first facet thereof;
   (b) an optical phase modulator optically coupled to said laser diode and having an anti-reflective coating facing the anti-reflective coating of said laser diode and having a reflective coating upon a facet opposite to the anti-reflective coating of said optical phase modulator;
   (c) tuning control means for shifting the phase of a light wave being modulated by the optical phase modulator such that a resonant frequency of said light wave is shifted; and
   (d) wherein a second facet of the laser diode, opposite the first facet thereof, is uncoated.

10. The laser source of claim 9 including a lensed fiber for optically coupling the optical phase modulator to the laser diode.

11. The laser source of claim 10 wherein said lensed fiber is positioned between the anti-reflective coating of the laser diode and the anti-reflective coating of said optical phase modulator.

* * * * *